United States Patent
Dimpflmaier et al.

(10) Patent No.: US 8,165,642 B2
(45) Date of Patent: Apr. 24, 2012

(54) ELECTRONIC DEVICE WITH DATA-RATE-DEPENDENT POWER AMPLIFIER BIAS

(75) Inventors: Ronald W. Dimpflmaier, Los Gatos, CA (US); Daniel C. Kong, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 450 days.

(21) Appl. No.: 12/465,260

(22) Filed: May 13, 2009

(65) Prior Publication Data

US 2010/0291975 A1 Nov. 18, 2010

(51) Int. Cl.
*H04M 1/00* (2006.01)

(52) U.S. Cl. .................................................. 455/572

(58) Field of Classification Search ............... 455/572, 455/569, 563, 557, 556, 517, 88, 90, 575, 455/345, 550
See application file for complete search history.

(56) References Cited

U.S. PATENT DOCUMENTS

| | | | |
|---|---|---|---|
| 3,613,011 A | 10/1971 | Wood | |
| 4,709,404 A | 11/1987 | Tamura et al. | |
| 5,055,797 A | 10/1991 | Chater | |
| 5,182,527 A | 1/1993 | Nakanishi et al. | |
| 5,410,276 A | 4/1995 | Hwang et al. | |
| 6,008,698 A | 12/1999 | Dacus et al. | |
| 6,163,706 A | 12/2000 | Rozenblit et al. | |
| 6,178,313 B1 | 1/2001 | Mages et al. | |
| 6,323,729 B1 | 11/2001 | Sevenhans et al. | |
| 6,377,825 B1 * | 4/2002 | Kennedy et al. | ........... 455/569.2 |
| 6,624,702 B1 | 9/2003 | Dening | |
| 6,735,422 B1 | 5/2004 | Baldwin et al. | |
| 6,819,910 B2 | 11/2004 | Shi et al. | |
| 6,819,938 B2 | 11/2004 | Sahota | |

(Continued)

FOREIGN PATENT DOCUMENTS

EP         1237297 A2    4/2002

(Continued)

OTHER PUBLICATIONS

Motorola, "Comparison of PAR and Cubic Metric for Power Derating", 3GPP Draft, R1-040642_EU9.5CUBICMETRIC, 3rd Generation Partnership Project (3GPP), Mobile Competence Centre, 650, Route Des Lucioles, F-06921 Sophia-Antipolis Cedex, France, vol. RAN WG4, no. Prague, Czech Republic, 20040812, Aug. 12, 2004, XP05017315.

(Continued)

*Primary Examiner* — Joseph Lauture
(74) *Attorney, Agent, or Firm* — Treyz Law Group; G. Victor Treyz; Chih-Yun Wu

(57) ABSTRACT

Wireless circuitry in an electronic device may contain output power amplifier circuitry for amplifying transmitted radio-frequency signals. The power amplifier circuitry may be powered using a bias voltage. The magnitude of the bias voltage can be selectively reduced to conserve power. Control circuitry can maintain a table of bias voltage settings to use under various conditions. These conditions may include required output powers as determined by link quality, transmission mode status, and required data rates. When link quality is low or when high data rates are required, the bias voltage can be maintained at a relatively high level to ensure that the power amplifier operates linearly and does not exhibit excessive noise. When link quality is high or when data rates are low as with voice calls, the bias voltage can be reduced to conserve power.

18 Claims, 7 Drawing Sheets

U.S. PATENT DOCUMENTS

| | | |
|---|---|---|
| 7,110,469 B2 | 9/2006 | Shi et al. |
| 7,289,778 B2 | 10/2007 | Sasaki |
| 7,342,955 B2 | 3/2008 | Forest et al. |
| 7,398,106 B2 | 7/2008 | Conyers et al. |
| 7,558,539 B2 | 7/2009 | Huynh et al. |
| 7,639,072 B2 | 12/2009 | Sorrells et al. |
| 7,962,109 B1 | 6/2011 | Stockstad et al. |
| 7,970,427 B2 | 6/2011 | Agahi et al. |
| 7,978,621 B2 * | 7/2011 | Rofougaran .................. 370/252 |
| 2002/0042256 A1 | 4/2002 | Baldwin et al. |
| 2002/0135343 A1 | 9/2002 | Underbrink et al. |
| 2004/0176145 A1 | 9/2004 | Lee et al. |
| 2004/0192408 A1 | 9/2004 | Sharp et al. |
| 2005/0136869 A1 | 6/2005 | Liu |
| 2005/0186923 A1 | 8/2005 | Chen et al. |
| 2006/0046668 A1 | 3/2006 | Uratani et al. |
| 2006/0068830 A1 | 3/2006 | Klomsdorf et al. |
| 2006/0246859 A1 | 11/2006 | Rofougaran et al. |
| 2006/0252392 A1 | 11/2006 | Beamish et al. |
| 2007/0066250 A1 | 3/2007 | Takahashi et al. |
| 2007/0135071 A1 | 6/2007 | Lee et al. |
| 2007/0249304 A1 | 10/2007 | Snelgrove et al. |
| 2007/0291873 A1 | 12/2007 | Saito et al. |
| 2008/0002786 A1 | 1/2008 | Kerth et al. |
| 2008/0284510 A1 | 11/2008 | Drogi et al. |
| 2009/0068966 A1 | 3/2009 | Drogi et al. |

FOREIGN PATENT DOCUMENTS

| | | |
|---|---|---|
| EP | 1986331 A1 | 10/2008 |
| JP | 2003163607 A | 8/2005 |
| WO | 9849771 A1 | 4/1998 |
| WO | 0122604 A1 | 3/2001 |
| WO | 03075452 A2 | 9/2003 |
| WO | 2004077664 A1 | 9/2004 |
| WO | 2007149346 A2 | 12/2007 |

OTHER PUBLICATIONS

Sorensen, U.S. Appl. No. 12/330,497, filed Dec. 8, 2008.

Sorensen, U.S. Patent Application No. 12/262,121, filed Oct. 30, 2008.

Sorensen et al, U.S. Appl. No. 12/110,260, filed Apr. 25, 2008.

Takeya et al., U.S. Appl. No. 12/125,534, filed May 28, 2008.

"R&S CMU200 Universal Radio Communication Tester", Rohde & Schwarz, Nov. 2007.

Sorensen et al., U.S. Appl. No. 12/262,121, filed Oct. 30, 2008.

"Understanding the Cubic Metric," [online]. Agilent Technologies, Inc. 2000-2009 [retrieved on Apr. 2, 2009] <URL: http://wireless.agilent.com/wireless/helpfiles/n7600b/cubic_metric.htm>.

* cited by examiner

|  | VOICE OR CM=0 | CM=1 | CM=2 | · · · |
|---|---|---|---|---|
| $P_{OUT1}$ | VCC10 | VCC11 | VCC12 |  |
| $P_{OUT2}$ | VCC20 | VCC21 | VCC22 |  |
| $P_{OUT3}$ | VCC30 | VCC31 | VCC32 | · · · |
| $\vdots$ |  |  |  |  |
| $P_{OUTN}$ | VCCN0 | VCCN1 | VCCN2 |  |

FIG. 5

ELECTRONIC DEVICE WITH DATA-RATE-DEPENDENT POWER AMPLIFIER BIAS

BACKGROUND

This invention relates generally to wireless communications circuitry, and more particularly, to wireless communications circuitry that makes power amplifier bias adjustments.

Handheld electronic devices and other portable electronic devices are becoming increasingly popular. Examples of handheld devices include handheld computers, cellular telephones, and media players. Popular portable electronic devices that are somewhat larger than traditional handheld electronic devices include laptop computers and tablet computers.

Due in part to their mobile nature, portable electronic devices are often provided with wireless communications capabilities. For example, handheld electronic devices may use long-range wireless communications to communicate with wireless base stations. Cellular telephones and other devices with cellular capabilities may communicate using cellular telephone bands at 850 MHz, 900 MHz, 1800 MHz, and 1900 MHz. Communications are also possible in the 2100 MHz communications band. When within range of an appropriate base station, portable electronic devices may use short-range wireless communications links. For example, portable electronic devices may communicate using the Wi-Fi® (IEEE 802.11) bands at 2.4 GHz and 5.0 GHz and the Bluetooth® band at 2.4 GHz.

To satisfy consumer demand for small form factor wireless devices, manufacturers are continually striving to reduce the size of components that are used in these devices. For example, manufacturers have made attempts to miniaturize the batteries used in handheld electronic devices.

An electronic device with a small battery has limited battery capacity. Unless care is taken to consume power wisely, an electronic device with a small battery may exhibit unacceptably short battery life. Techniques for reducing power consumption may be particularly important in wireless devices that support cellular telephone communications, because users of cellular telephone devices often demand long talk times.

It would therefore be desirable to be able to provide wireless communications circuitry with improved power management capabilities.

SUMMARY

A portable electronic device such as a cellular telephone or other handheld electronic device is provided with wireless communications circuitry. The wireless communications circuitry may include power amplifier circuitry. Adjustable power supply voltage circuitry may supply an adjustable bias voltage for powering the power amplifier circuitry.

Storage and processing circuitry in the portable electronic device may control the level of bias voltage that is produced by the adjustable power supply voltage circuitry. When transmitting data at relatively high data rates, the bias voltage may be set to a fairly high level. This helps to ensure that the power amplifier circuitry has sufficient headroom to transmit high-data-rate signals without exhibiting undesirable nonlinearities. When transmitting data at lower data rates, high bias voltages are generally not necessary. Power can be conserved in these situations by reducing the level of the bias voltage that is supplied to the power amplifier.

The storage and processing circuitry may maintain a look-up table of desired bias voltages. The look-up table may be used to determine suitable bias voltages for the power amplifier circuitry as a function of different desired output powers, different operating modes (e.g., voice or data), and different transmitted data rates. The storage and processing circuitry can quantify the amount of data that is being transmitted using a data transmission rate parameter such as a cubic metric.

Further features of the invention, its nature and various advantages will be more apparent from the accompanying drawings and the following detailed description of the preferred embodiments.

BRIEF DESCRIPTION OF THE DRAWINGS

FIG. 5 is a table showing how control circuitry in an electronic device may make power amplifier circuitry power supply voltage adjustments based on criteria such as required output power, transmit mode, and cubic metric value in accordance with an embodiment of the present invention.

DETAILED DESCRIPTION

This relates generally to wireless communications, and more particularly, to managing power consumption by wireless communications circuitry in wireless electronic devices.

The wireless electronic devices may be portable electronic devices such as laptop computers or small portable computers of the type that are sometimes referred to as ultraportables. Portable electronic devices may also be somewhat smaller devices. Examples of smaller portable electronic devices include wrist-watch devices, pendant devices, headphone and earpiece devices, and other wearable and miniature devices. With one suitable arrangement, the portable electronic devices may be handheld electronic devices.

The wireless electronic devices may be, for example, cellular telephones, media players with wireless communications capabilities, handheld computers (also sometimes called personal digital assistants), remote controllers, global positioning system (GPS) devices, and handheld gaming devices. Wireless electronic devices such as these may perform multiple functions. For example, a cellular telephone may include media player functionality and may have the ability to run games, email applications, web browsing applications, and other software.

Figure 1:
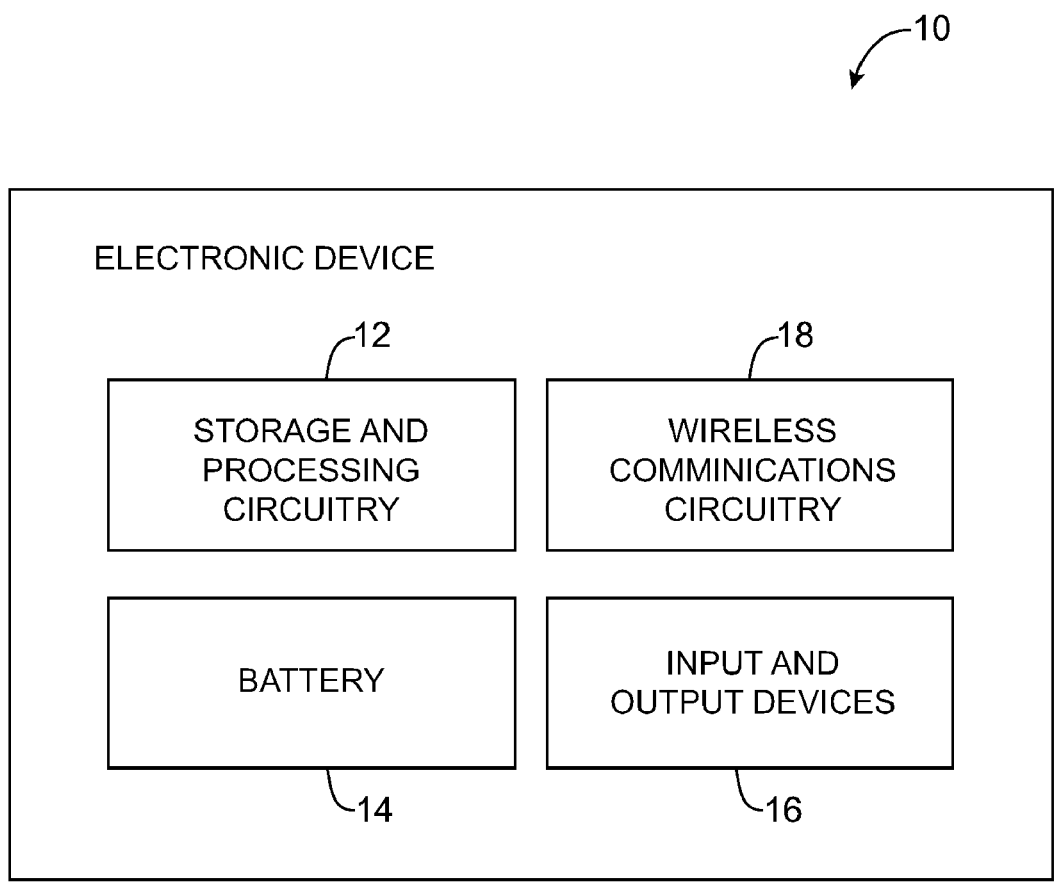
FIG. 1 is a schematic diagram of an illustrative electronic device with wireless communications circuitry in accordance with an embodiment of the present invention.

A diagram of an illustrative electronic device such as a handheld electronic device or other portable electronic device is shown in FIG. 1. Device 10 of FIG. 1 may be, a mobile telephone, a mobile telephone with media player capabilities, a handheld computer, a remote control, a game player, a global positioning system (GPS) device, a laptop computer, a tablet computer, an ultraportable computer, a device with the capacity to perform the functions of one or more of such devices, or any other suitable portable electronic device.

As shown in FIG. 1, device 10 may include storage and processing circuitry 12. Storage and processing circuitry 12 may include one or more different types of storage such as hard disk drive storage, nonvolatile memory (e.g., flash memory or other electrically-programmable-read-only memory), volatile memory (e.g., static or dynamic random-access-memory), etc. Storage and processing circuitry 12 may be used in controlling the operation of device 10. Processing circuitry in circuitry 12 may be based on processors such as microprocessors, microcontrollers, digital signal processors, dedicated processing circuits, power management circuits, audio and video chips, radio-frequency transceiver processing circuits, radio-frequency integrated circuits of the type that are sometimes referred to as baseband modules, and other suitable integrated circuits.

With one suitable arrangement, storage and processing circuitry 12 may be used to run software on device 10, such as internet browsing applications, voice-over-internet-protocol (VOIP) telephone call applications, email applications, media playback applications, operating system functions, etc. Storage and processing circuitry 12 may be used in implementing suitable communications protocols. Communications protocols that may be implemented using storage and processing circuitry 12 include internet protocols, wireless local area network protocols (e.g., IEEE 802.11 protocols—sometimes referred to as Wi-Fi®), protocols for other short-range wireless communications links such as the Bluetooth® protocol, protocols for handling 2G cellular telephone communications services, 3G communications protocols such as high-speed uplink packet access (HSUPA) protocols, etc.

Device 10 may have one or more batteries such as battery 14. To minimize power consumption and thereby extend the life of battery 14, storage and processing circuitry 12 may be used in implementing power management functions for device 10. For example, storage and processing circuitry 12 may be used to adjust radio-frequency power amplifier circuitry on device 10 and may be used in adjusting input power levels provided to the input of radio-frequency power amplifier circuitry on device 10 from a transceiver circuit. Power amplifier adjustments that may be made include gain setting adjustments (e.g., to selectively turn on and off gain stages) and power supply voltage adjustments (also sometimes referred to as bias voltage adjustments). These adjustments may be made automatically in real time based on tables of preferred control settings for various different operating conditions.

Control algorithms that are implemented on storage and processing circuitry 12 may be used in controlling the operation of device 10. For example, a desired power amplifier bias voltage may be determined by a control algorithm in real time based on criteria such as required output power and the type of transmission mode in which device 10 is operating (e.g., in data mode or voice mode). Code may be stored in storage and processing circuitry 12 that configures storage and processing circuitry 12 to implement the control algorithm. Among other functions, the code may help to reduce power amplifier bias voltages whenever possible to conserve power. To prevent undesirable reductions in performance, power amplifier bias voltage reductions may be made selectively, whenever reduced bias voltages will not make it difficult for device 10 to meet desired performance criteria.

Input-output devices 16 may be used to allow data to be supplied to device 10 and to allow data to be provided from device 10 to external devices. Examples of input-output devices 16 that may be used in device 10 include display screens such as touch screens (e.g., liquid crystal displays or organic light-emitting diode displays), buttons, joysticks, click wheels, scrolling wheels, touch pads, key pads, keyboards, microphones, speakers and other devices for creating sound, cameras, sensors, etc. A user can control the operation of device 10 by supplying commands through devices 16. Devices 16 may also be used to convey visual or sonic information to the user of device 10. Devices 16 may include connectors for forming data ports (e.g., for attaching external equipment such as computers, accessories, etc.).

Wireless communications devices 18 may include communications circuitry such as radio-frequency (RF) transceiver circuitry formed from one or more integrated circuits, power amplifier circuitry (e.g., power amplifier circuitry that is controlled by control signals from storage and processing circuitry 14 to minimize power consumption while satisfying desired performance criteria), passive RF components, antennas, and other circuitry for handling RF wireless signals. Wireless signals can also be sent using light (e.g., using infrared communications).

Device 10 can communicate with external devices such as accessories, computing equipment, and wireless networks over wired and wireless communications paths.

For example, accessories such as wired or wireless headsets may communicate with device 10. Device 10 may also be connected to audio-video equipment (e.g., wireless speakers, a game controller, or other equipment that receives and plays audio and video content) or a peripheral such as a wireless printer or camera.

Device 10 may use a wired or wireless path to communicate with a personal computer or other computing equipment. The computing equipment may be, for example, a computer that has an associated wireless access point (router) or an internal or external wireless card that establishes a wireless connection with device 10. The computer may be a server (e.g., an internet server), a local area network computer with or without internet access, a user's own personal computer, a peer device (e.g., another portable electronic device 10), or any other suitable computing equipment.

Device 10 can also communicate with wireless network equipment, such as cellular telephone base stations, wireless data networks, computers associated with wireless networks, etc. Such wireless networks may include network management equipment that monitors the wireless signal strength of the wireless handsets such as device 10 that are in communication with the network. To improve the overall performance of the network and to ensure that interference between handsets is minimized, the network management equipment may send power adjustment commands (sometimes referred to as transmit power control commands or TCP commands) to each handset. The transmit power control settings that are provided to the handsets direct handsets with weak signals to increase their transmit powers, so that their signals will be properly received by the network. At the same time, the transmit power control settings may instruct handsets whose signals are being received clearly at high power to reduce their transmit power control settings. This reduces interference between handsets and allows the network to maximize its use of available wireless bandwidth.

When device 10 receives transmit power control settings from the network or at other suitable times, device 10 may make suitable transmission power adjustments. For example, device 10 may adjust the power level of signals that are provided by transceiver circuitry to radio-frequency power amplifiers on device 10 and may adjust the radio-frequency power amplifiers. Power amplifier adjustments such as these may include gain mode settings adjustments and power supply voltage adjustments.

The output signals from the power amplifiers on device 10 are wirelessly transmitted from device 10 to suitable receivers using antennas on devices 10. The settings for wireless communications circuitry 18 may include gain mode adjustments that control the gain settings of power amplifiers. For example, a gain mode adjustment may control whether a power amplifier is operating in a high gain mode in which all power amplifier stages that are available are being used or a low gain mode in which one or more of the gain stages on the power amplifier have been shut down to conserve power. Power supply voltage adjustments may be used to help minimize power consumption at a given gain setting. In typical circuit architectures, a transceiver circuit may supply radio-frequency signals to the input of a power amplifier for transmission through an antenna. The power at which the transceiver circuit outputs these radio-frequency signals establishes an input power level (sometimes referred to herein as Pin) for the power amplifier. Input power adjustments (adjustments to Pin) can be made to adjust the power of radio-frequency signals transmitted by device 10.

The antenna structures and wireless communications devices of device 10 may support communications over any suitable wireless communications bands. For example, wireless communications devices 18 may be used to cover communications frequency bands such as cellular telephone voice and data bands at 850 MHz, 900 MHz, 1800 MHz, 1900 MHz, and the communications band at 2100 MHz band, the Wi-Fi® (IEEE 802.11) bands at 2.4 GHz and 5.0 GHz (also sometimes referred to as wireless local area network or WLAN bands), the Bluetooth® band at 2.4 GHz, and the global positioning system (GPS) band at 1550 MHz.

Device 10 can cover these communications bands and other suitable communications bands with proper configuration of the antenna structures in wireless communications circuitry 18. Any suitable antenna structures may be used in device 10. For example, device 10 may have one antenna or may have multiple antennas. The antennas in device 10 may each be used to cover a single communications band or each antenna may cover multiple communications bands. If desired, one or more antennas may cover a single band while one or more additional antennas are each used to cover multiple bands.

Figure 2:
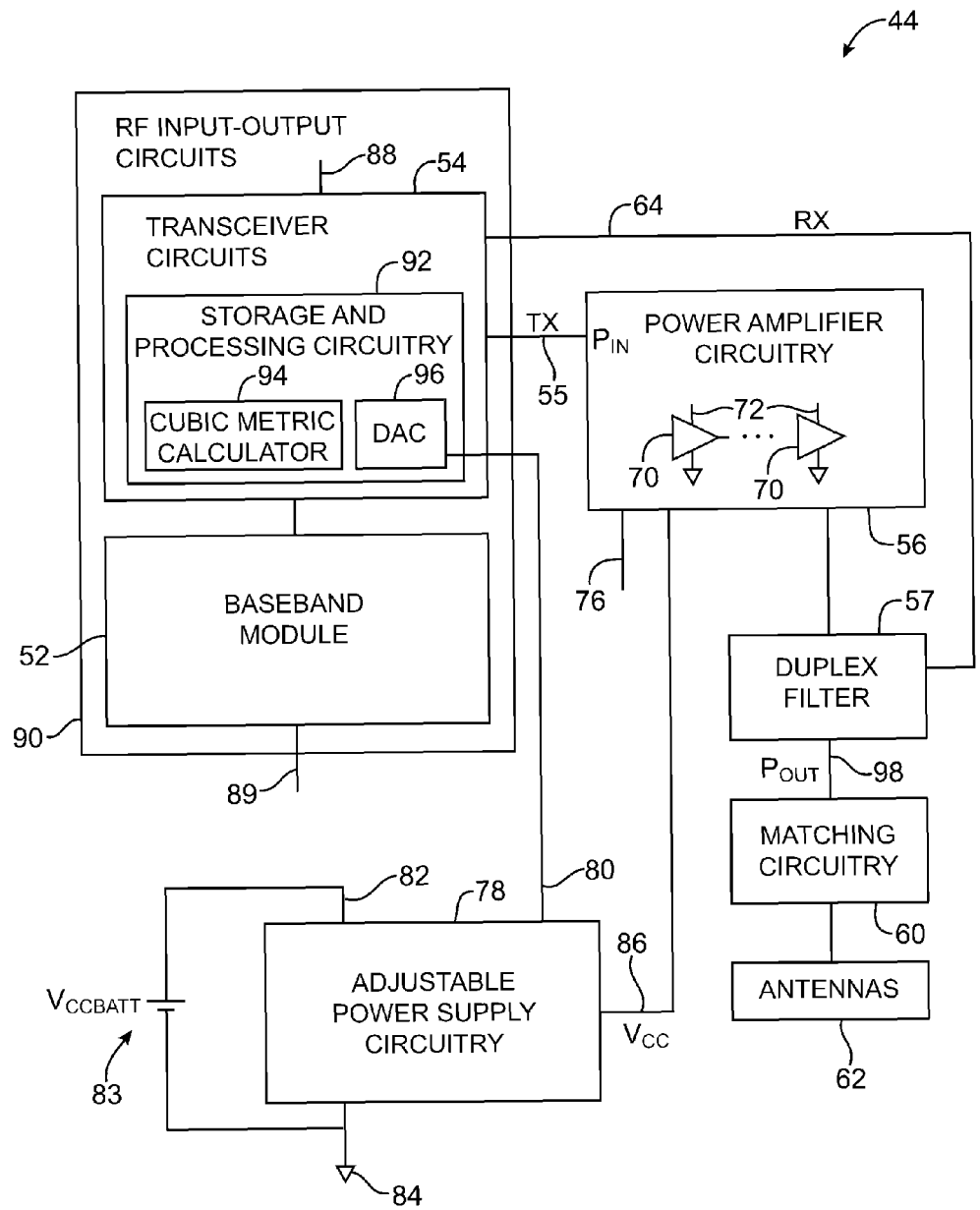
FIG. 2 is a circuit diagram of illustrative wireless communications circuitry in accordance with an embodiment of the present invention.

Illustrative wireless communications circuitry that may be used in circuitry 18 of FIG. 1 in device 10 is shown in FIG. 2. As shown in FIG. 2, wireless communications circuitry 44 may include one or more antennas such as antennas 62 and may include radio-frequency input-output circuits 90. During signal transmission operations, circuitry 90 may supply radio-frequency signals that are transmitted by antennas 62. During signal reception operations, circuitry 90 may accept radio-frequency signals that have been received by antennas 62.

Data signals that are to be transmitted by device 10 may be provided to baseband module 52 (e.g., from storage and processing circuitry 12 of FIG. 1). Baseband module 52 may be implemented using a single integrated circuit (e.g., a baseband processor integrated circuit) or using multiple circuits. Baseband processor 52 may receive signals to be transmitted over antenna 62 at input line 89 (e.g., from storage and processing circuitry 12). Baseband processor 52 may provide signals that are to be transmitted to transmitter circuitry within RF transceiver circuitry 54. The transmitter circuitry may be coupled to power amplifier circuitry 56 via path 55. Control path 88 may receive control signals from storage and processing circuitry 12 (FIG. 1). These control signals may be used to control the power of the radio-frequency signals that the transmitter circuitry within transceiver circuitry 54 supplies to the input of power amplifiers 56 via path 55. This transmitted radio-frequency signal power level is sometimes referred to herein as Pin, because it represents the input power to power amplifier circuitry 56.

During data transmission, power amplifier circuitry 56 may boost the output power of transmitted signals to a sufficiently high level to ensure adequate signal transmission. Circuitry 57 may contain a radio-frequency duplexer and other radio-frequency output stage circuitry such as radio-frequency switches and passive elements. Switches may, if desired, be used to switch circuitry 44 between a transmitting mode and a receiving mode. Duplex filter 57 may be used to route input and output signals based on their frequency.

Matching circuitry 60 may include a network of passive components such as resistors, inductors, and capacitors and ensures that antenna structures 62 are impedance matched to the rest of the circuitry 44. Wireless signals that are received by antenna structures 62 may be passed to receiver circuitry in transceiver circuitry 54 over a path such as path 64.

Each power amplifier (e.g., each power amplifier in power amplifiers 56) may include one or more power amplifier stages such as stages 70. As an example, each power amplifier may be used to handle a separate communications band and each such power amplifier may have three series-connected power amplifier stages 70. Stages 70 may have inputs such as inputs 72 that receive bias voltages and other input signals. These input signals may be provided using a control signal path such as path 76. The control signals from storage and processing circuitry 12 may be used to selectively enable and disable stages 70. Bias voltage may be supplied to inputs 72 using path 86.

By enabling and disabling stages 70 selectively, the power amplifier may be placed into different gain modes. For example, the power amplifier may be placed into a high gain mode by enabling all three of power amplifier stages 70 or may be placed into a low gain mode by enabling two of the power amplifier stages. Other configurations may be used if desired. For example, a very low gain mode may be supported by turning on only one of three gain stages or arrangements with more than three gain mode settings may be provided by selectively enabling other combinations of gain stages (e.g., in power amplifiers with three or more than three gains stages).

Adjustable power supply circuitry such as adjustable power supply circuitry 78 may be powered by voltage source 83. Voltage source 83 may be, for example, a battery such as battery 14 of FIG. 1. Source 83 may supply a positive battery voltage to adjustable power supply circuitry 78 at positive power supply terminal 82 and may supply a ground voltage to adjustable power supply circuitry 78 at ground power supply terminal 84. Source 83 may be implemented using a lithium ion battery, a lithium polymer battery, or a battery of any other suitable type.

Initially, the voltage supplied by a battery may be high. As the battery becomes depleted, the voltage supplied by the battery will tend to drop. By using adjustable power supply circuitry 78, the amount of voltage Vcc that is supplied to power amplifier circuitry 56 over power supply voltage path 86 may be maintained at a desired value. For example, power supply circuitry 78 may, under appropriate conditions, receive a raw battery voltage from source 83 that drops with time and may produce a relatively constant output power Vcc on output path 86. This may help to avoid wasteful situations in which the circuitry of power amplifiers 56 is supplied with excessive voltages while the battery of source 83 is fresh. Such excessive voltages may lead to wasteful power consumption by circuitry 56.

Adjustable power supply circuitry 78 may be controlled by control signals received over a path such as path 80. The control signals may be provided to adjustable power supply circuitry 78 from storage and processing circuitry 12 (FIG. 1) or any other suitable control circuitry (e.g., circuitry implemented in baseband module 52, circuitry in transceiver circuits 54, etc.). In the example of FIG. 2, transceiver circuitry 54 includes storage and processing circuitry 92 that may be used in controlling adjustable power supply circuitry 78. Storage and processing circuitry 92 may include cubic metric calculator circuit 94 and digital-to-analog converter (DAC) circuit 96. Cubic metric calculator 94 may compute a wireless communications parameter called the cubic metric from known attributes of the radio-frequency signals that are currently being transmitted by circuitry 44.

Storage and processing circuitry 92 may maintain a table of control settings to be used in controlling power supply circuitry 78. The table may include a list of bias voltages (Vcc values) that are to be supplied by adjustable power supply circuitry 78. Based on the known operating conditions of circuitry 44 such as its current transmission mode (data or voice), the current cubic metric value (a value that ranges between 0 dB and 4 dB), and the desired output power value Pout to be produced by power amplifier circuitry 56 (e.g., the output power from amplifier 56 as measured at output 98 of duplex filter 57), and based on the values of the control settings in the table, storage and processing circuitry 92 may direct digital-to-analog converter 96 to generate appropriate control signals on path 80 (e.g., analog control voltages).

The control signals that are supplied by digital-to-analog converter 96 on path 80 may be used to adjust the magnitude of the positive power supply voltage Vcc that is provided to power amplifier circuitry 56 over path 86. These power supply voltage adjustments may be made at the same time as gain mode adjustments are being made to the power amplifier circuitry 56 and at the same time that adjustments are being made to the power (Pin) on path 55.

The value of the bias voltage Vcc that is used in powering radio-frequency power amplifier circuitry 56 can sometimes be reduced to conserve power. Care should be taken, however, to ensure that the bias voltage is not reduced too much. If Vcc is reduced excessively, power amplifier circuitry 56 will not perform linearly and may exhibit clipping. If powered with Vcc values that are so low as to induce clipping, wireless communications circuitry 44 may exhibit excessive non-linearity and may not meet expected performance criteria such as minimum required levels of adjacent channel leakage ratio (ACLR). In situations such as these, power amplifier circuitry 56 is sometimes referred to as having insufficient "headroom" to perform its intended amplification function.

If Vcc is sufficiently large, power amplifier circuitry 56 will operate linearly and will not exhibit clipping. Power amplifier circuitry 56 will therefore be able to handle signals with large peak-to-average (PAR) values. High-data-rate signals such as high-data-rate signals using the HSUPA protocol are associated with relatively large PAR values. In situations in which power amplifier circuitry 56 is powered with a sufficiently large bias voltage Vcc, power amplifier circuitry 56 will therefore exhibit sufficient headroom to handle these high-data-rate signals.

Figure 3:
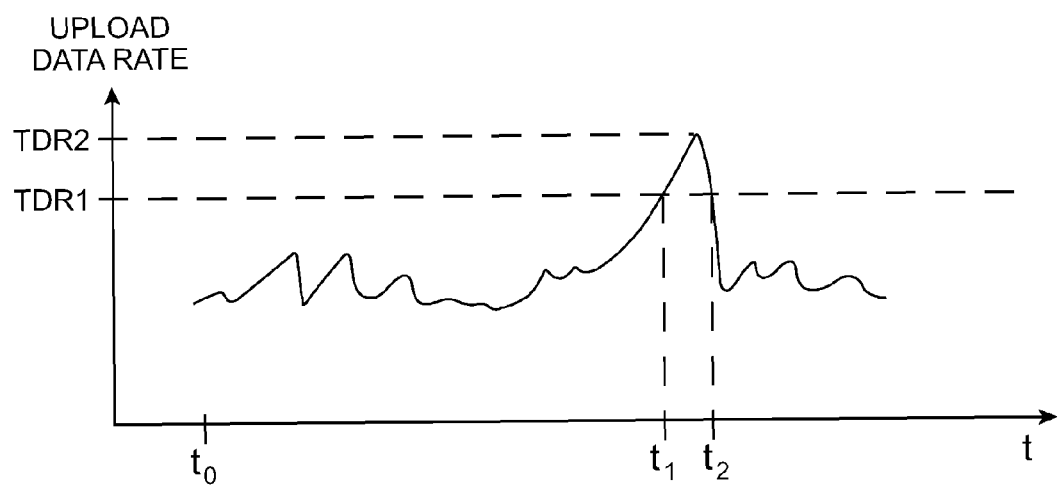
FIG. 3 is a graph showing how the peak-to-average ratio of a radio-frequency signal may vary as a function of time during communications using wireless communications circuitry in an electronic device in accordance with an embodiment of the present invention.

A graph showing how the rate at which data is transmitted from device 10 and therefore the peak-to-average ratio of transmitted radio-frequency signals may vary as a function of time is presented in FIG. 3. At time t0, the amount of data transmitted from circuitry 44 may be relatively low (i.e., less than TDR1). It may be possible to operate device 10 and circuitry 44 with a relatively low data rate and an associated low peak-to-average ratio (PAR) such as this when the user of device 10 is on a voice call or is only transmitting data at a relatively low HSUPA data rate.

When device 10 needs to upload more data, the required data transmit rate may rise. In the example of FIG. 3, the rate at which data is being uploaded is relatively high (i.e., between TDR1 and TDR2) at times between t1 and t2. These elevated data transmission rates are generally associated with high PAR values. Large data transmission rates may be used, for example, to accommodate the transmission of large files (e.g., email attachments such as photos) or to accommodate high data rates for streaming data. Examples of activities that may require elevated data rates include video transmission (e.g., for video telephone calls) and gaming. These are merely illustrative examples. In general, any applications that require the use of elevated data rates may be run on device 10 if desired.

The need for transmitting large amounts of data is typically momentary. For example, a user may need to upload a picture to a server. During the upload operation (i.e., from time t1 to time t2 in the example of FIG. 3), the peak-to-average ratio for the transmitted signal may be relatively high (e.g., 8 dB). When the upload is complete (e.g., after time t2 in the FIG. 3 example), the user may only need to make a voice call with device 10. During the voice call, the peak-to-average ratio for the transmitted signal may be relatively low (e.g., 3.5 dB).

To handle these time-varying requirements without wasting power, the storage and processing circuitry of device 10 may direct adjustable power supply circuitry 78 to adjust bias voltage Vcc in real time. When link quality is poor and/or when a high data rate is required for transmitted signals, the value of Vcc may be increased to ensure that power amplifier circuitry 56 has sufficient headroom. When link quality improves and/or when the required data rate for transmitted signals decreases (e.g., when uploading small amounts of data or when in voice mode), the value of Vcc may be decreased. These decreased values of Vcc help to reduce the amount of power consumed by power amplifier circuitry 56.

Wireless links such as those associated with 2G protocols sometimes support only relatively low data upload rates (e.g., 1 Mbps or less). Other wireless links, such as those associated with the 3G high-speed uplink packet access (HSUPA) mobile telephony protocol, may support significantly higher upload data rates (e.g., up to several Mbps or even five Mbps or more or seven Mbps or more). Voice mode operations (in which only voice data is being uploaded from the user) generally require low data rates (typically less than 100 kbps and significantly less than 1 Mbps). Data mode uploading operations can involve significant upload data rates, particularly when the data mode is an HSUPA data mode. To ensure sufficient linearity and low noise for power amplifier circuitry 56, power amplifier circuitry 56 can be provided with increased bias voltages whenever the data transmission rates are elevated. For example, more bias voltage can be supplied when the upload rate exceeds 5 Mbps than when the upload rate is less than 1 Mbps or 2 Mbps. Bias voltage increases can also be made depending on mode (e.g., less bias for voice mode and more bias for HSUPA mode, particularly at higher HSUPA data rates).

Required levels of transmit power are typically determined based on received transmit power control (TPC) commands. When a base station determines that a link with device 10 is poor, the base station may transmit a TPC command to device 10 that instructs device 10 to increase its output power. When the base station determines that the link quality is good and that the amount of power being received from device 10 is more than sufficient, the base station may issue a TPC command that directs device 10 to reduce its output power. This lowered output power helps prevent device 10 from interfering with the operation of nearby devices. The reduced requirement in output power level also allows power to be conserved by allowing the magnitude of the bias voltage Vcc that is produced by adjustable power supply circuitry 78 to be lowered.

Adjustable power supply circuitry 78 may be implemented using a DC/DC converter or any other suitable power conversion circuit. Circuitry 78 may receive a relatively higher voltage Vccbatt from battery 83 over power supply path 82 and may produce a corresponding regulated power supply voltage Vcc at a relatively lower voltage Vcc at output path 86. In a typical arrangement, the battery voltage Vccbatt may range from about 4.3 volts to about 3.6 volts and output voltage Vcc may range from about 3.6 volts to 2.7 volts. The voltage Vcc may be adjusted based on control signals received over path 80. Voltage Vcc may be adjusted continuously (e.g., to provide any desired output voltage in the range of 2.7 to 3.6 volts or other suitable range) or may be set to a selected one of two or more discrete levels (e.g., 2.7 volts, 3.0 volts, 3.4 volts, 3.6 volts, etc.).

Power amplifier circuitry 56 may include multiple power amplifiers each of which handles a different communications band (e.g., bands at communications frequencies such as 850 MHz, 900 MHz, 1800 MHz, and 1900 MHz). If desired, some or all of power amplifiers in circuitry 56 may handle multiple communications bands (e.g., adjacent bands).

Power amplifier circuitry 56 may receive control signals over path 76. The control signals may be used to selectively turn on and off particular blocks of circuitry within each power amplifier. This type of adjustment may be used to place each power amplifier 56 in a desired gain mode. In a bimodal arrangement, each power amplifier may be placed in either a high gain mode or a low gain mode. If desired, other types of multimode arrangements may be supported (e.g., arrangements in which power amplifiers 56 can be adjusted to operate at three or more different gain settings.)

Operating power amplifier circuitry 56 at bias voltages at which more headroom than is necessary is produced can waste power. Accordingly, the magnitude of power supply voltage Vcc may be adjusted in real time by storage and processing circuitry 12 to help minimize power consumption. The way in which bias voltage Vcc may be selectively reduced to conserve power as a function of required transmit power level Pout is illustrated in the graph of FIG. 4.

Figure 4:
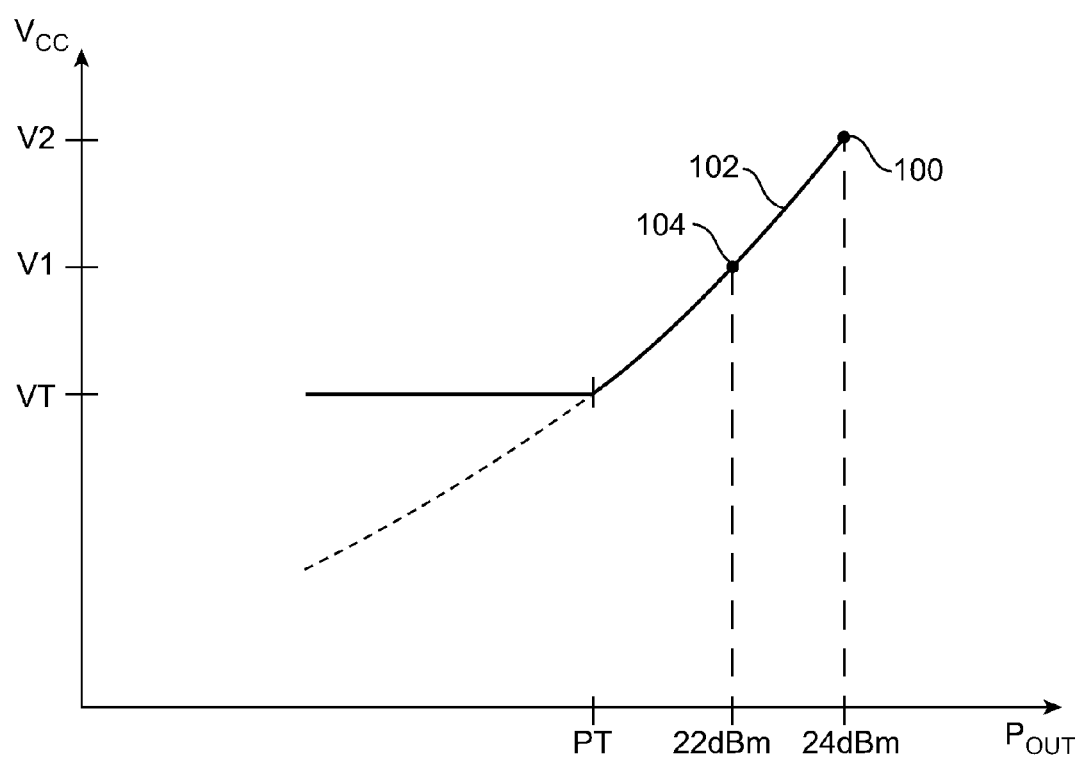
FIG. 4 is a graph showing how power amplifier circuitry in an electronic device may be provided with different bias voltages when transmitting radio-frequency signals at different output powers in accordance with an embodiment of the present invention.

The curve of FIG. 4 shows how the power supply voltage Vcc for power amplifier circuitry 56 may be reduced to minimize power consumption (assuming a fixed data rate transmission requirement). The amount of power that may be saved depends, in this example, on the amount of output power that is required at the output of power amplifier 56. When required (e.g., in accordance with a wireless network TPC instruction or other requirement), the power amplifier may be operated at its highest operating voltage Vcc. For example, when an output power of 24 dBm is required (in the FIG. 4 example), the power amplifier may be placed in its high gain mode and may be powered with a power supply voltage of V2 (point 100 on line 102). When a lower output power is required, such as 21 dBm, it is no longer necessary to operate the power amplifier at V2. Rather, the power supply voltage for the power amplifier may be reduced to a Vcc value of V1 (point 104 on line 102). This helps to reduce power consumption. If lower output powers are required, Vcc can be reduced further.

The efficiency of DC/DC converter 78 and other power regulator circuitry may be affected by the operating voltage Vcc and operating current Icc that DC/DC converter 78 produces at its output. At high output voltages Vcc and high output currents Icc, adjustable power supply circuitry such as DC/DC converters may operate at peak efficiency. At lower Vcc and Icc levels, efficiency tends to drop. It may therefore be most efficient to reduce power supply voltage Vcc only in situations in which the power amplifier power savings that are obtained by reducing Vcc are not offset by increases in power consumption in DC/DC converter 78. When Vcc is reduced, the values of power supply current and voltage that are used in powering power amplifier 56 tend to fall and overall power consumption will be reduced, so long as the reductions in power amplifier power consumption are not overwhelmed by power losses due to operating power supply circuitry 78 in an inefficient regime. As a result of these considerations, it may be desirable to reduce the value of Vcc to no less than VT, even at required output powers below PT (as an example).

In addition to adjusting Vcc based on output power requirements, Vcc can be adjusted based on required rates for data transmission and associated PAR values. Low transmission rates are associated with voice calls and small amounts of uploaded data (e.g., when web browsing). Higher transmission rates are associated with uploading large files and participating in high-data-rate services (e.g., video conferencing, gaming, etc.). Storage and processing circuitry 92 can determine which types of applications are active on device 10 at a given time. For example, storage and processing circuitry 92 can determine when a user is making a voice telephone call (i.e., device 10 is in voice mode) and can determine when a user is uploading data (i.e., device 10 is in data mode and is uploading data other than the data associated with a normal voice call). This information can be gathered by storage and processing circuitry 92 by monitoring which applications are running on device 10 and by polling active applications for status information.

Storage and processing circuitry 92 may include software-based and hardware-based resources for computing an appropriate bias voltage Vcc as a function of the data rate transmission requirements (and associated PAR requirements) of device 10. Any suitable parameter may be used to represent the amount of required voltage Vcc based on the data transmission rate of circuitry 44. With one suitable arrangement, which is described herein as an example, circuitry in transceiver circuits 54 is used to implement a cubic metric calculator 94. Cubic metric calculator 94 computes the well-known cubic metric (CM) parameter. During transmission, the value of adjacent channel leakage ratio (ACLR) for a given channel depends on the third order non-linearity of the gain characteristic of power amplifier circuitry. When accommodating high data rates and associated peak-to-average power ratios in the transmitted signal, it is necessary for power amplifier circuitry 56 to be powered at relatively high bias voltages to ensure adequate amplifier linearity and thereby ensure that minimum desired ACLR levels are not exceeded. Cubic metric calculator 94 can quantify the amount of increase in Vcc that is needed for a given peak-to-average ratio and associated data transmission rate. In particular, calculator 94 can compute cubic metric CM based on the current transmit channel configuration for the signals being transmitted by RF input-output circuits 90 so that storage and processing circuitry can use the value of CM that is computed in real time to determine how to adjust Vcc. Because the CM value is responsive to the amount of Vcc increase that is needed to accommodate increases in PAR and data transmission rate, the CM value is sometimes referred to as a data transmission rate parameter.

Any suitable control algorithm scheme may be used. With one suitable arrangement, which is described herein as an example, storage and processing circuitry 92 may use a look-up table such as table 106 of FIG. 5. As shown in FIG. 5, table 106 may have rows and columns of possible values for bias voltage Vcc. The value of Vcc to be used depends on a desired output power Pout for the currently transmitted signal. The value of Vcc also depends on whether device 10 is currently operating in voice mode or data mode (e.g., HSUPA data mode) and, if operating in date mode, on the data transmission rate.

Any suitable parameter that is sensitive to the data upload rate may be used to represent conditions in which there is a desire to increase the bias voltage. For example, table 106 can be populated with desired bias voltage values Vcc corresponding to different data rates (in Mbps). The data transmission rate parameter need not be linearly proportional to data rate, so long as the value of the data transmission rate parameter reflects differences between situations in which relatively low bias voltages are desirable (i.e., when the data transmission rate parameter has a relatively low value) and situations in which the relatively high bias voltages are desirable (i.e.., when the data transmission rate parameter has a relatively high value). With one suitable arrangement, look-up table 106 has bias voltage values that change as a function of the value of the cubic metric CM. This is, however, merely illustrative. The look-up table values may vary as a function of any other suitable data transmission rate parameter that represents how much power amplifier bias is to be used.

Figure 6:
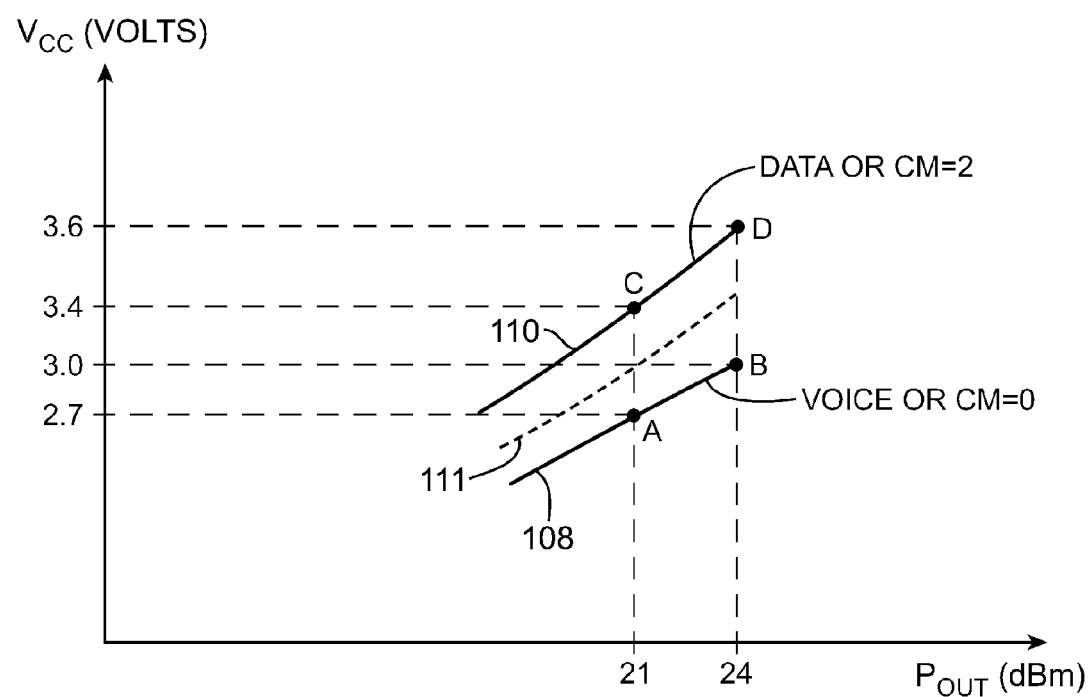
FIG. 6 is a graph showing how power amplifier circuitry power supply voltage adjustments may be made as a function of different required output powers, transmit modes, and cubic metric values in accordance with an embodiment of the present invention.

The graph of FIG. 6 illustrates how Vcc can be adjusted as a function of various operating conditions. When relatively low data rates are to be supported (e.g., rates associated with voice calls or CM values of 0 dB), power amplifier circuitry 56 can be biased at a bias voltage Vcc selected from curve 108. For example, a bias voltage of 2.7 volts (point A) may be used to bias power amplifier circuitry 56 when an output power of 21 dBm is required (e.g., when link quality is good because the user is close to a base station). Storage and processing circuitry 92 can use the first column of table 106 in FIG. 5 to look up the appropriate bias voltage value based on the known output power value (21 dBm).

If the quality of the link between device 10 and its associated base station degrades (e.g., because the user travels to a location that is more distant from the base station), the base station may issue a TPC command for device 10 that instructs device 10 to increase its output power to 24 dBm. To ensure that power amplifier performance is acceptable under these operating conditions (e.g., to ensure that minimum ACLR values are met), device 10 can increase Vcc to 3.0 volts (point B on curve 108).

If device 10 is operated in data mode and a relatively high data transmission rate is required (e.g., CM=2), device 10 can select Vcc values for power amplifier circuitry 56 using curve 110. If the required output power is 21 dBm (for example), device 10 can provide a Vcc value of 3.4 volts to power amplifier circuitry 56 (point C). A Vcc value of 3.6 volts can be provided to power amplifier circuitry 56 (point D) if the required output power increases to 24 dBm. There may be any suitable number of columns in table 106 of FIG. 5 and any suitable corresponding number of bias voltage adjustment lines in the graph of FIG. 6 (as indicated schematically by dashed line 111). The use of two lines 108 and 110 in FIG. 6 and the use of several different cubic metric values (CM=0, 1, 2 . . . ) in table 106 of FIG. 5 are merely illustrative examples.

Figure 7:
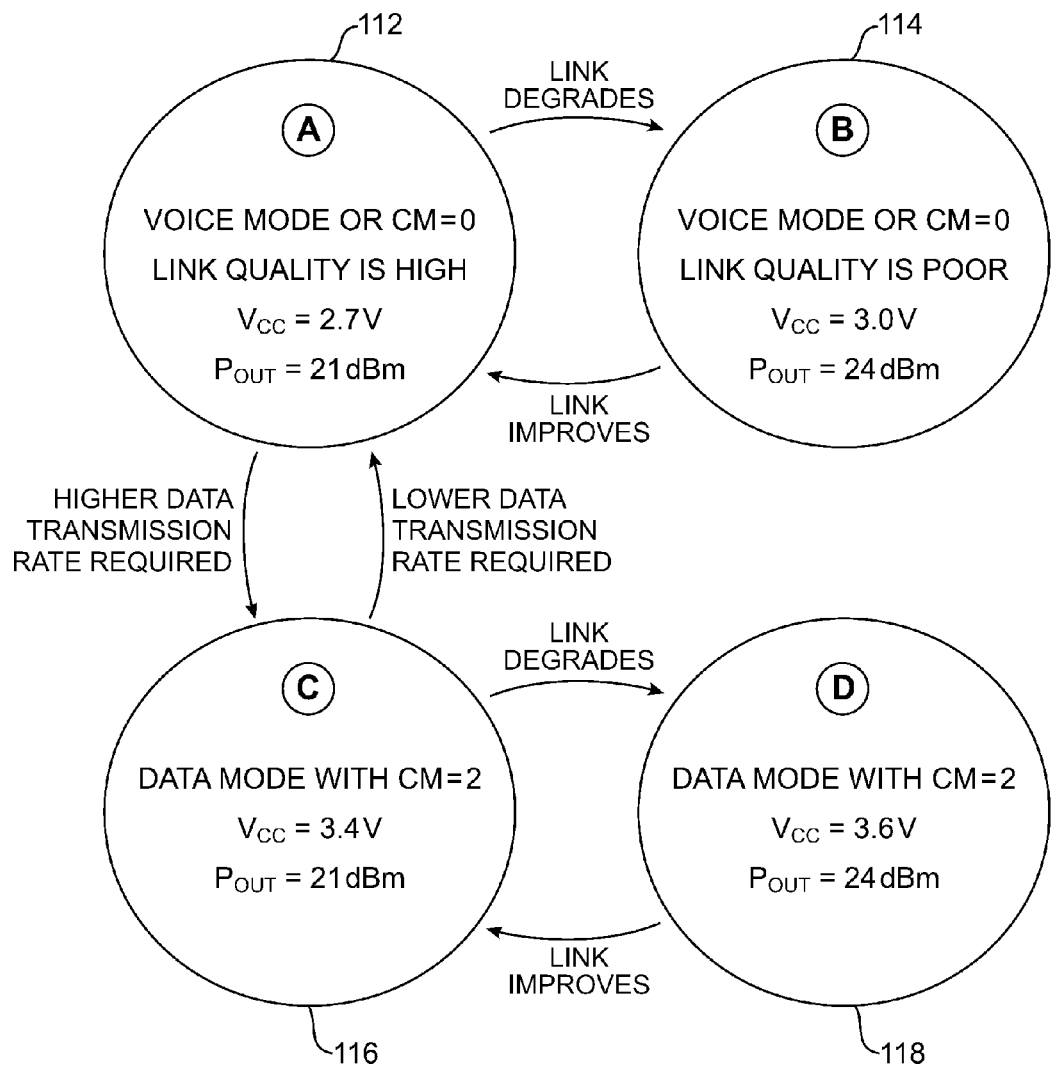
FIG. 7 is a diagram showing how power amplifier circuitry power supply voltage adjustments may be made as a function of output power adjustments made to accommodate link quality variations, modes of transmission, and cubic metric values in accordance with an embodiment of the present invention.

The diagram of FIG. 7 shows operations involved in making real time adjustments to the bias voltage for power amplifier circuitry 56. In FIG. 7, four discrete operating states are shown (states 112, 114, 116, and 118) to present a simplified example. During normal operation, other output powers Pout and data transmission rate requirements will typically arise.

Device 10 may initially be operated in state 112, corresponding to point A on line 108 of FIG. 6. In this state, device 10 is being operated in voice mode (e.g., the user is conducting a voice call) or data is being uploaded at a data rate corresponding to a CM value of 0 dB (i.e., a low PAR value). The quality of the wireless communications link between device 10 and the external equipment with which device 10 is communicating (e.g., network equipment such as a cellular telephone base station) is relatively high, so the output power requirement Pout is relatively low. In this state, Vcc may be 2.7 volts (as an example).

If link quality degrades, device 10 can increase the output power Pout of power amplifier 56 to 24 dBm and can increase the bias voltage Vcc for power amplifier 56 accordingly to ensure that performance remains acceptable. In this situation, device 10 will operate in state 114 (point B on line 108 in the FIG. 6 example).

If link quality improves without any change in the data transmission mode (voice or data) and without any change in the data transmission rate, device 10 may return to state 112.

If device 10 is operating in state 112 and an application that is running on device 10 requires an increased data transmission rate (e.g., to upload a large data file or to support a high-data rate service such as a service in which device 10 uploads video), device 10 may increase bias voltage Vcc for power amplifier 56 to 3.4 volts without increasing output power Pout. In this configuration, which corresponds to an illustrative cubic metric value of 2 dB (i.e., an elevated PAR value), device 10 may operate in state 116 (point C on line 110 in the FIG. 6 example).

When device 10 is operating in state 116 and the quality of the wireless communications link between device 10 and the base station degrades, the base station may ask that device 10 increase its output power to 24 dBm. In this situation, device 10 may increase its output power to 24 dBm and may simultaneously increase the bias voltage for power amplifier 56 to 3.6 volts to ensure that required performance criteria (e.g., minimum ACLR values) are maintained. When operating in this way, device 10 is in state 118, corresponding to point D on line 110 in the FIG. 6 example.

Adjustments such as the adjustments of FIG. 7 may be made using the adjustable power supply in real time to ensure that performance constraints are satisfied while power consumption is reduced.

The foregoing is merely illustrative of the principles of this invention and various modifications can be made by those skilled in the art without departing from the scope and spirit of the invention.

What is claimed is:

1. Wireless communications circuitry on a portable electronic device, comprising:
radio-frequency power amplifier circuitry that amplifies radio-frequency signals that are transmitted from the portable electronic device at a data transmission rate;

adjustable power supply circuitry that supplies an adjustable power supply voltage to the radio-frequency power amplifier circuitry; and storage and processing circuitry that directs the adjustable power supply circuitry to supply the adjustable power supply voltage to the radio-frequency power amplifier circuitry at a level that is selected based at least partly on the data transmission rate, wherein the storage and processing circuitry comprises a cubic metric calculator that calculates a cubic metric for the radio-frequency signals that are transmitted and wherein the storage and processing circuitry directs the adjustable power supply circuitry to supply the adjustable power supply voltage based at least partly on the cubic metric.

2. The wireless communications circuitry defined in claim 1 wherein the storage and processing circuitry further comprises a digital-to-analog converter that supplies an analog control signal to the adjustable power supply circuitry based at least partly on the cubic metric.

3. The wireless communications circuitry defined in claim 1 wherein the storage and processing circuitry stores a look-up table that the storage and processing uses in determining appropriate levels for the adjustable power supply voltage.

4. Wireless communications circuitry on a portable electronic device, comprising:

radio-frequency power amplifier circuitry that amplifies radio-frequency signals that are transmitted from the portable electronic device at a data transmission rate;

adjustable power supply circuitry that supplies an adjustable power supply voltage to the radio-frequency power amplifier circuitry; and storage and processing circuitry that directs the adjustable power supply circuitry to supply the adjustable power supply voltage to the radio-frequency power amplifier circuitry at a level that is selected based at least partly on the data transmission rate, wherein the storage and processing circuitry further comprises a digital-to-analog converter that supplies an analog control signal to the adjustable power supply circuitry based at least partly on the data transmission rate.

5. Wireless communications circuitry on a portable electronic device, comprising:

radio-frequency power amplifier circuitry that amplifies radio-frequency signals that are transmitted from the portable electronic device at a data transmission rate;

adjustable power supply circuitry that supplies an adjustable power supply voltage to the radio-frequency power amplifier circuitry; and storage and processing circuitry that directs the adjustable power supply circuitry to supply the adjustable power supply voltage to the radio-frequency power amplifier circuitry at a level that is selected based at least partly on the data transmission rate, wherein the radio-frequency signals comprise voice data when the wireless communications circuitry is operated in a first mode, wherein the radio-frequency signals comprise high-speed uplink packet access data with a data upload rate of greater than 5 Mbps when the wireless communications circuitry is operated in a second mode, and wherein the storage and processing circuitry is configured to direct the adjustable power supply circuitry to supply the adjustable power supply voltage to the radio-frequency power amplifier circuitry at a lower value during the first mode than during the second mode.

6. The wireless communications circuitry defined in claim 5 wherein the wireless communications circuitry operates using power from a battery, the wireless communications circuitry further comprising:

a battery input in the adjustable power supply circuitry that receives a battery voltage from the battery; and a power supply voltage output at which the adjustable power supply voltage is supplied to the radio-frequency power amplifier circuitry, wherein the adjustable power supply voltage is less than the battery voltage.

7. An electronic device, comprising:

radio-frequency input-output circuitry that supplies radio-frequency signals to be wirelessly transmitted from the electronic device to external equipment;

radio-frequency power amplifier circuitry that amplifies the radio-frequency signals;

adjustable power supply circuitry that supplies an adjustable power supply voltage to the radio-frequency power amplifier circuitry; and storage and processing circuitry that determines whether the electronic device is operating in a voice mode or a data mode and that directs the adjustable power supply circuitry to supply the adjustable power supply voltage to the radio-frequency power amplifier circuitry at a level that is selected based at least partly on whether the electronic device is determined to be operating in the voice mode or is determined to be operating in the data mode.

8. The electronic device defined in claim 7 wherein the data mode comprises a high-speed uplink packet access data mode in which the radio-frequency signals include data uploaded at a data rate of at least 5 Mbps.

9. The electronic device defined in claim 8 wherein the voice mode comprises a mode in which the radio-frequency signals represent data uploaded at a data rate of less than 100 kbps.

10. The electronic device defined in claim 7 wherein the storage and processing circuitry includes a cubic metric calculator that computes a cubic metric for the radio-frequency signals that are currently being transmitted and wherein the storage and processing circuitry is configured to direct the adjustable power supply circuitry to supply the adjustable power supply voltage to the radio-frequency power amplifier circuitry at a level that is selected based at least partly on the computed cubic metric.

11. The electronic device defined in claim 10 wherein the storage and processing circuitry stores a look-up table that the storage and processing uses in determining appropriate levels for the adjustable power supply voltage.

12. The electronic device defined in claim 7 wherein the storage and processing circuitry stores a look-up table that the storage and processing uses in determining appropriate levels for the adjustable power supply voltage, wherein the storage and processing circuitry is configured to store voltage bias entries in the look-up table that vary as a function of a data transmission rate parameter associated with multiple different data transmission rates for the radio-frequency signals.

13. A portable electronic device, comprising:

radio-frequency power amplifier circuitry that amplifies radio-frequency signals to be wirelessly transmitted from the portable electronic device;

storage and processing circuitry; and adjustable power supply circuitry that supplies an adjustable power supply voltage to the radio-frequency power amplifier circuitry based on control signals received from the storage and processing circuitry, wherein the storage and processing circuitry directs the adjustable power supply voltage to supply the adjustable power supply voltage to the radio-frequency power amplifier circuitry at a level that is selected based at least partly on a data transmission rate parameter associated with the radio-frequency signals, wherein the portable electronic device comprises a cellular telephone and wherein the storage and processing circuitry comprises a cubic metric calculator that calculates the data rate transmission parameter.

14. A portable electronic device, comprising:
radio-frequency power amplifier circuitry that amplifies radio-frequency signals to be wirelessly transmitted from the portable electronic device;
storage and processing circuitry; and
adjustable power supply circuitry that supplies an adjustable power supply voltage to the radio-frequency power amplifier circuitry based on control signals received from the storage and processing circuitry, wherein the storage and processing circuitry directs the adjustable power supply voltage to supply the adjustable power supply voltage to the radio-frequency power amplifier circuitry at a level that is selected based at least partly on a data transmission rate parameter associated with the radio-frequency signals, wherein:
the storage and processing circuitry is configured to determine when the portable electronic device is being operated in a voice mode in which the radio-frequency signals are being used to transmit data at less than 100 kbps and is configured to determine when the portable electronic device is being operated in a data mode in which the radio-frequency signals are being used to transmit data at more than 1 Mbps; and
the storage and processing circuitry is configured to direct the adjustable power supply voltage to supply the adjustable power supply voltage to the radio-frequency power amplifier at a first level when the portable electronic device is in the voice mode and at a second level when the portable electronic device is in the data mode.

15. The portable electronic device defined in claim 14 wherein the first level is less than the second level.

16. the portable electronic device defined in claim 15 wherein the data rate transmission parameter comprises a cubic metric and wherein the storage and processing circuitry comprises a cubic metric calculator that calculates the cubic metric.

17. A portable electronic device, comprising:
radio-frequency power amplifier circuitry that amplifies radio-frequency signals to be wirelessly transmitted from the portable electronic device;
storage and processing circuitry; and
adjustable power supply circuitry that supplies an adjustable power supply voltage to the radio-frequency power amplifier circuitry based on control signals received from the storage and processing circuitry, wherein the storage and processing circuitry directs the adjustable power supply voltage to supply the adjustable power supply voltage to the radio-frequency power amplifier circuitry at a level that is selected based at least partly on a data transmission rate parameter associated with the radio-frequency signals, wherein the storage and processing circuitry is configured to direct the adjustable power supply voltage to supply the adjustable power supply voltage to the radio-frequency power amplifier circuitry based on desired output power levels for the radio-frequency power amplifier circuitry.

18. A portable electronic device, comprising:
radio-frequency power amplifier circuitry that amplifies radio-frequency signals to be wirelessly transmitted from the portable electronic device;
storage and processing circuitry; and
adjustable power supply circuitry that supplies an adjustable power supply voltage to the radio-frequency power amplifier circuitry based on control signals received from the storage and processing circuitry, wherein the storage and processing circuitry directs the adjustable power supply voltage to supply the adjustable power supply voltage to the radio-frequency power amplifier circuitry at a level that is selected based at least partly on a data transmission rate parameter associated with the radio-frequency signals, wherein the data transmission rate parameter comprises a cubic metric, wherein the storage and processing circuitry stores a look-up table that the storage and processing uses in determining appropriate levels for the adjustable power supply voltage, and wherein the look-up table includes voltage bias entries that vary as a function of desired output power levels for the radio-frequency power amplifier and that vary as a function of the cubic metric.

* * * * *